United States Patent [19]

Palmer et al.

[11] 4,185,722
[45] Jan. 29, 1980

[54] MAGNETIC CLUTCH AND BRAKE ASSEMBLY

[75] Inventors: Ansell W. Palmer, Hampton, N.H.; Francis J. Stevens, North Berwick, Me.

[73] Assignee: General Electric Company, Somersworth, N.H.

[21] Appl. No.: 845,201

[22] Filed: Oct. 25, 1977

[51] Int. Cl.² ............................................. F16D 67/06
[52] U.S. Cl. ......................... 192/18 B; 192/53 D; 192/108; 188/68; 188/161
[58] Field of Search ............... 192/18 B, 12 D, 12 R, 192/53 D, 108, 67 R; 324/116, 103 R; 188/31, 69, 161, 164, 68

[56] References Cited

U.S. PATENT DOCUMENTS

| 3,173,525 | 3/1965 | Hergert | 192/18 B |
| 3,285,378 | 11/1966 | Garrison et al. | 192/12 R |
| 4,050,020 | 9/1977 | Germer et al. | 364/483 |

FOREIGN PATENT DOCUMENTS

| 121270 | 4/1946 | Australia | 192/67 |
| 1144976 | 3/1963 | Fed. Rep. of Germany | 192/67 |

*Primary Examiner*—Benjamin Wyche
*Assistant Examiner*—David C. Reichard
*Attorney, Agent, or Firm*—Robert E. Brunson; Francis X. Doyle

[57] ABSTRACT

A positive acting magnetic clutch and brake assembly characterized by including a movable, magnetic member provided with two sets of detents arranged respectively on its opposing outer surfaces. The member is alternately shiftable into either a brake position, in engagement with a braking post mounted to engage one of the sets of detents, or to a drive position in which a reciprocally mounted mechanical dog is engaged with the other set of detents in a non-slip driving coupling between the magnetic member and a clutch assembly. A reciprocal mounting arrangement for the dog enables the magnetic member to be moved into driving contact with the clutch assembly before the dog becomes positively engaged with any of the detents on the magnetic member.

10 Claims, 6 Drawing Figures

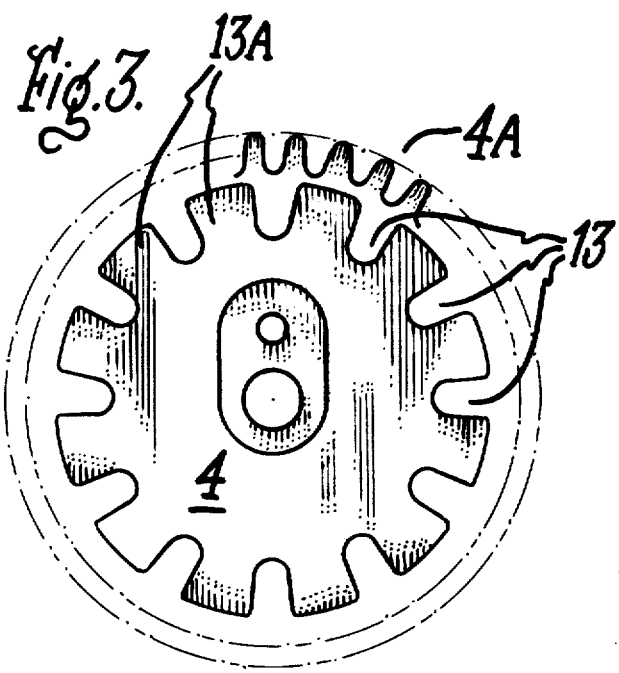
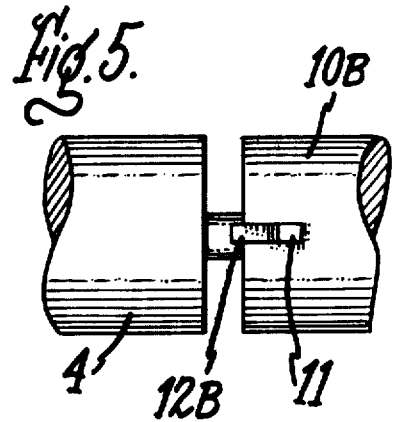
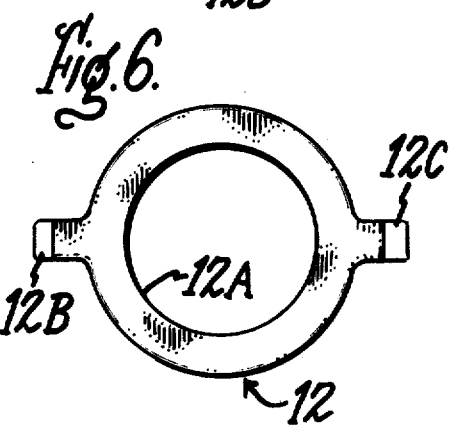
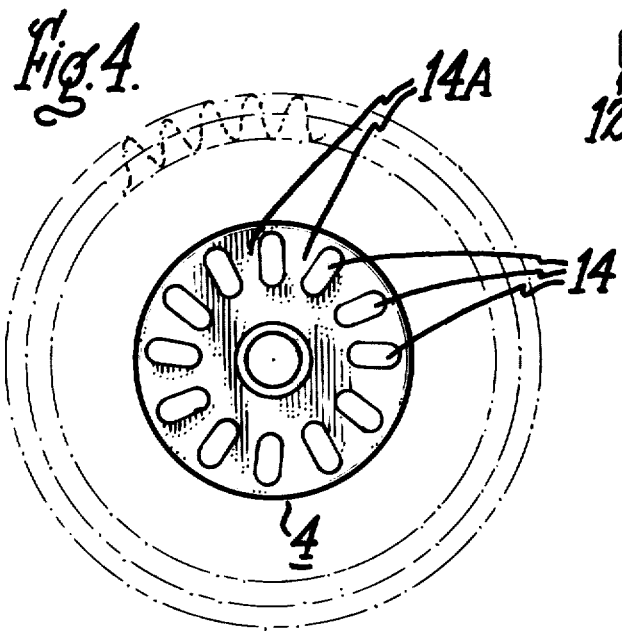

MAGNETIC CLUTCH AND BRAKE ASSEMBLY

BACKGROUND OF THE INVENTION

The invention relates to a magnetic clutch and brake assembly for selectively coupling a driven gear to either a power input idler gear, or to positively secure the rotatable gear in a braked position. More particularly, the invention relates to a clutch and brake assembly that is useful in driving and controlling the position of rotatable instrument indicating dials such as the decade gear driven indicating pointers commonly employed on electrical power measuring meters.

A wide variety of magnetic clutch and brake mechanisms are generally well-known in the prior art. An example of a relatively recently developed magnetic clutch and brake mechanism that has been used successfully in conjunction with an electric meter dial drive is described in U.S. Pat. No. 4,050,020, which issued on Sept. 20, 1977 and is assigned to the assignee of the present invention. In fact, the unique features of the present invention involve improvements that can readily be made in the type of magnetic clutch and brake mechanism disclosed in that earlier patent.

As a consequence of operating experience with the type of magnetic clutch and brake assembly disclosed in that patent, it was discovered that many electric meter applications demand the provision of the more positive driving and braking actions than are provided by that magnetic clutch and brake mechanism. The mechanism described in that patent depends solely on friction and magnetic coupling between its relatively movable components to afford desired clutching and braking functions. Accordingly, the torque capability of the device is limited to the holding strength of the combined friction and magnetic forces between two sliding clutch surfaces. Although under most normally encountered meter operating conditions little or no slippage does, in fact, occur between either the clutch or the magnetic brake of those mechanisms, field experience has shown that undesirable slippage will occur in those few applications where the meter is subject to excessive vibration. Of course, when such slippage occurs, which the shiftable magnetic member of such a clutch and brake assembly in either its driving or braking mode, some error is introduced in the meter dial readings. The slippage either reflects relative movement of the indicating input gear train, which is not recorded on the movable dials of the meter register, or it may represent random error in either an up-scale or down-scale movement of the register dial due to random movement induced in the dials by vibration and rotation of the dial gear train when it is supposed to be held securely in a braked position. In order to avoid such undesirable errors in resultant meter readings, it is necessary to improve the type of magnetic clutch and brake mechanism described in the foregoing patent by incorporating an economically feasible positive driving and braking means in it.

Accordingly, it is a primary object of the present invention to overcome the above-noted disadvantages of known types of magnetic clutch and brake mechanisms by providing an accurate, and economical to manufacture, clutch and brake assembly that is free of such shortcomings.

Another object of the invention is to provide a magnetic clutch and brake assembly that has a positive, high torque drive coupling and brake mechanism that prevents more than a predetermined minimum angular degree of slippage between a shiftable magnetic member and associated idler gear and braking post.

Yet another object of the invention is to provide an alternative drive coupling between a shiftable magnetic member of a magnetic clutch assembly that is operable to enable the magnetic member and clutch assembly to engage one another in driving relationship without requiring a positive drive coupling between the members to be engaged in its positive driving relationship.

A still further object of the invention is to provide a magnetic braking assembly with a positive brake means that mechanically prevents more than a predetermined degree of angular rotation of a shiftable magnetic member after it is moved to its braked position even when the mechanism is subjected to substantial mechanical vibration.

Additional objects and advantages of the invention will be apparent to those skilled in the art from the description of it presented herein considered in conjunction with the accompanying drawings.

SUMMARY OF THE INVENTION

In one preferred embodiment of the invention a magnetic clutch and brake assembly is provided with a shiftable magnetic member that is selectively movable, responsive to energization of an associated solenoid coil, between a brake post and an input idler gear. The shiftable magnetic member is provided with first and second sets of detents that cooperate, respectively, with the brake post and a reciprocally mounted dog positioned in driving relationship on the idler gear. Both the brake post and reciprocally mounted dog are made of magnetic metal that is attracted to the shiftable magnetic member thereby to cause these components of the assembly to be magnetically pulled into one of the associated sets of detents when the shiftable magnetic member rotates sufficiently to align them with the detents. The dog is positioned in a slot formed in the idler gear assembly and restricted in its axial movement between an idler gear core member and a collar provided for this purpose on a shaft supporting the dog. Within this restricted range of movement the collar is retractable to enable the magnetic member of the assembly to contact the core portion of the idler clutch assembly in driving relationship without requiring the dog to be aligned with, or positioned in positive driving engagement with, one of the detents in the shiftable magnetic member. The slot for positioning the dog is made narrow enough to keep its axial teeth aligned with the shaft on which it is mounted so that the teeth will drop into the detents on the magnetic member as they become aligned with the teeth.

DESCRIPTION OF THE DRAWING

FIG. 3 is a schematic plan view of the left end of a shiftable magnetic member in the clutch and brake assembly illustrated in FIGS. 1 and 2, showing one set of detents formed in the shiftable magnetic member pursuant to the invention.

FIG. 4 is a schematic plan view of the right end of the shiftable magnetic member of the clutch and brake assembly illustrated in FIGS. 1 and 2, showing a second set of detents formed therein for cooperation with the positive drive clutch means of the invention.

FIG. 5 is an enlarged, fragmentary, side elevation of the abutting ends of the shiftable magnetic member and the idler clutch assembly shown in FIGS. 1 and 2, illustrating the positive drive clutch dog positioned between them.

FIG. 6 is a plan view of the positive clutch dog drive shown in FIGS. 1 and 2, as viewed from the left side in those views.

DESCRIPTION OF THE PREFERRED EMBODIMENT

Figure 1:
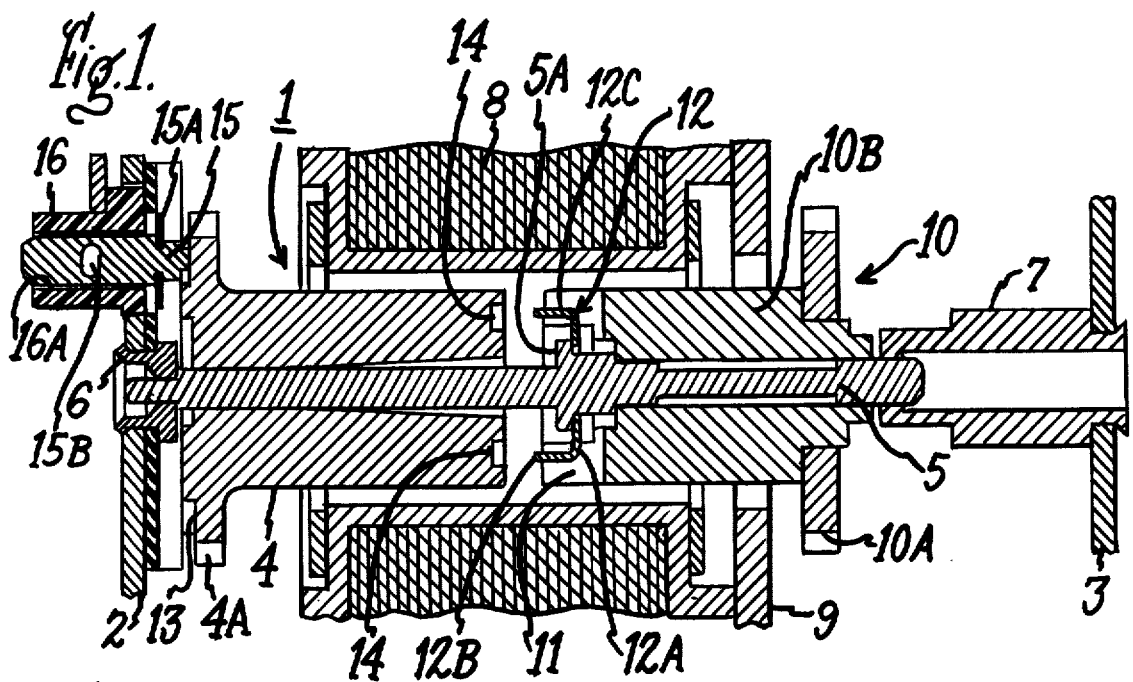
FIG. 1 is a fragmentary, side elevation, partly in cross-section of a magnetic clutch and brake assembly constructed in accordance with the present invention and mounted on frame elements of a meter register with which the assembly is adapted to cooperate.

The preferred embodiment of the invention is particularly suitable for application with a time-of-day meter register and associated register control means of the kind fully described in the above-mentioned U.S. Pat. No. 4,050,020. Accordingly, the description of the invention presented here will be limited to its characteristic features, because reference to that prior art patent may be made by any reader desiring a more thorough explanation of the type of meter environment and associated clutch and brake control circuitry that is suitable for such an application of the invention. Referring now to FIG. 1 of the drawing, there is shown a magnetic clutch and brake assembly 1 that is constructed in accordance with the invention. The assembly is mounted, in a manner that will be more fully explained below, between two frame plates 2 and 3 of an electric meter register, which may be of any suitable conventional form. As is more fully explained in the above-mentioned patent, the register plate 2 also supports a series of meter indicating dials that are driven in normal fashion by a decade gear train, the input gear of which is positioned in continuous meshing engagement with a gear portion 4A of magnetic member 4 in the clutch and brake assembly 1. Such dials and their associated decade gear train are not illustrated in FIG. 1 because it is only necessary to an understanding of the present invention to recognize that the decade gear train has an input rotatable gear that is continually meshed with the integral gear wheel 4a formed on the magnetic member 4. Although the meter dial pointers, associated decade gear train and input rotatable gear are not illustrated in FIG. 1, such components are fully shown and described in the above-referenced patent if the reader wishes to gain more familiarity with such mechanisms. In the interest of completeness, the disclosure of U.S. Pat. No. 4,050,020 is included herein by reference thereto.

As shown in FIG. 1, a shaft 5, which in this embodiment is formed of a non-magnetic material such as brass is rotatably mounted in a pair of metal bearings 6 and 7 that are staked, respectively, into the meter frame plates 2 and 3. Axial movement of the shaft 5 relative to the plates 2 and 3 is restricted within a desired tolerance by the collars and shoulders shown on the shaft.

A suitably compact solenoid coil 8 is mounted in spaced relationship to the input gear for the decade dial gear train (not shown). Conventional mounting means such as welding or metal screws are used to secure the housing of the solenoid coil to a third frame plate 9 of the meter register with which the clutch and brake assembly 1 is associated. In order to operate the clutch and brake assembly 1 of the invention to move the magnetic member between the brake post 15 and the idler gear assembly 10, means (not shown) for selectively energizing the solenoid are connected to coil 8 to enable it to be energized with direct current to produce magnetic flux fields of either a forward or a reverse polarity through the center of the coil. A suitable control circuit and solenoid energizing means to afford this desired function is described in the above-referenced U.S. Pat. No. 4,050,020. Such means for selectively energizing the solenoid coil 8 are operable to move the magnetic member 4 between a braked position and a clutch engaging position thereby to alternately brake the input rotatable gear for the decade dial gear train or to couple it in driving relationship to an idler clutch gear 10A that forms part of a clutch idler gear assembly 10, which also includes a core member 10B on which the gear 10A is staked. The core member 10B is formed of magnetizable metal, such as soft iron, so that it is continuously biased toward the magnetic member 4 by the flux produced by the permanent magnet material of that member.

The core member 10B is further characterized by having an axial slot 11 formed in the end thereof that is closest to the magnetic member 4 when the component parts are assembled on shaft 5. An end view of the slot 11 is shown in FIG. 5, while one side of the slot 11 is shown in FIGS. 1 and 2.

Figure 2:
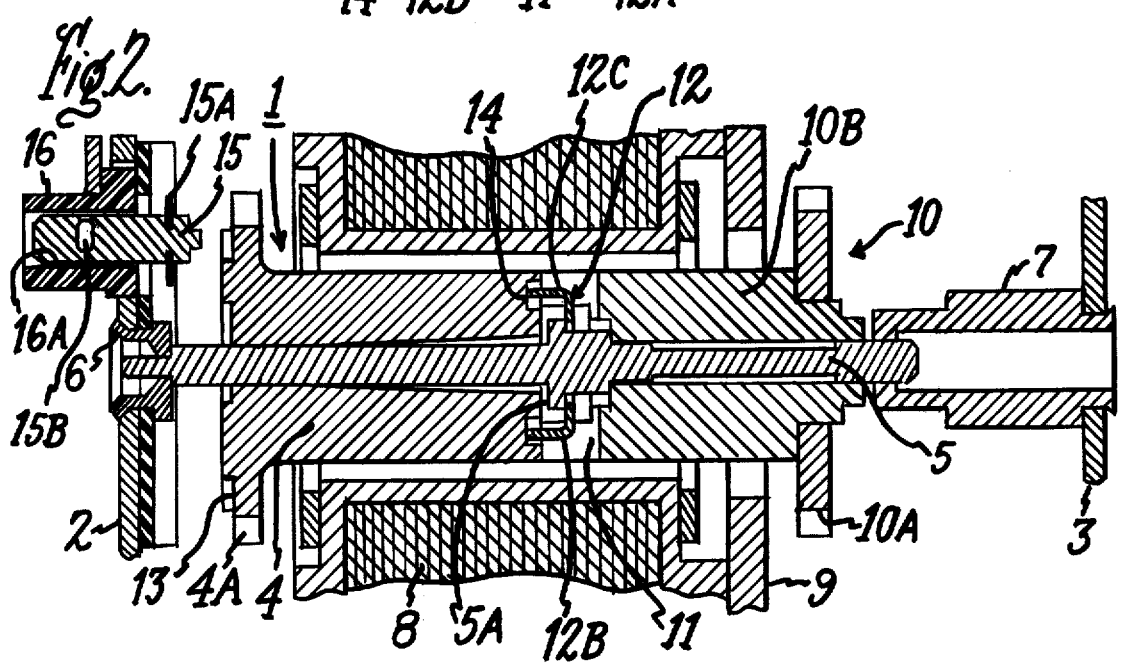
FIG. 2 is a fragmentary, side elevation, partly in cross-section, of the magnetic clutch and brake assembly shown in FIG. 1, illustrating the relative position of the component parts as they are arranged when the clutch assembly is engaged in positive driving relationship.

To afford the positive clutching objective of the invention, a dog 12 is mounted between the magnetic member 4 and the clutch idler gear assembly 10, as shown in FIGS. 1, 2 and 5. In this form of the invention the dog 12 is formed of magnetizable metal such as steel so that it is responsive to the magnetic field produced by the magnetic member 4 and is continuously biased toward the magnetic member 4 for the purpose that will be more fully described below. As is more clearly shown in FIG. 6, the dog 12 comprises an annulus 12A and a tooth portion comprising two teeth 12B and 12C that are narrower than the slot 11 in the core portion 10B of the clutch gear assembly 10. The annulus 12A is slidably mounted around the shaft 5 for reciprocal movement relative to the shaft, and the tooth portion (12B, 12C) of the dog is positioned within the axial slot 11 of the clutch gear assembly core member 10B. Movement of the annulus 12A away from the core member 10B is restricted by a collar 5A on the shaft 5. Otherwise, the annulus 12A of dog 12 is free to slide axially between the collar 5A and the core member 10B sufficiently to enable the teeth 12B and 12C to be completely retracted within the slot 11 so that the core member 10B can be moved into driving contact with the magnetic member 4 without requiring the teeth portion of the dog 12 to be positioned in positive driving relationship with the detents (described more fully below) in the magnetic member 4. In order to keep the dog 12 from being twisted in the slot 11, the teeth 12B and 12C of the tooth portion of the dog are made to have longitudinal axes substantially greater in length than the width of the slot 11.

The clutch idler gear assembly 10 is rotatably mounted on the shaft 5 and is limited in axial movement by engagement on one end with a shoulder on the shaft 5 as seen in FIG. 1, while being limited in movement in an axial direction at the other end by the bushing 7. Thus, although the assembly 10 can move axially within this restricted range of movement, it is prevented, by engagement with the shoulder on the shaft 5 from following the magnetic chamber 4 to which it is attracted by the magnetic flux produced by the member 4.

Pursuant to the invention, a first set of detents 13 and a second set of detents 14 are formed, respectively, on opposite ends of the magnetic member 4. Some of these detents are shown in the cross-sectional views of FIGS. 1 and 2, but can be more fully seen in FIGS. 3 and 4. Each of the sets of detents 13 and 14, respectively, comprise a series of angularly spaced recesses that are formed in otherwise generally flat areas of the end surfaces of the magnetic member 4 thereby to form circular patterns of recesses on the end surfaces. In this embodiment of the invention, the first and second sets of detents (13 and 14) are formed by molding the respective recesses into the magnetic material of magnetic member 4. Of course, in alternative embodiments the recesses may be suitably formed by machining or otherwise mounting projections or other wall means on the end portions of the magnetic member 4 to afford the positive braking and clutching functions that will be more fully explained below.

In order to perform the positive braking desired for the invention, a brake post 15 is mounted on the meter frame plate 2 in cooperating relationship with the first set of detents 13 for positively braking the magnetic member 4 when it is moved to position a portion of the brake post 15 within a detent of the first set of detents 13. In this form of the invention, the brake post 15 is made of magnetizable metal such as soft cast iron and is slidably mounted within the bore 16A of a bushing 16 which is fixedly positioned in the meter register face plate 2. The maximum outward limit of movement of the brake post 15 relative to the bushing 16 and frame member 2 is determined by a collar 15A or other suitable conventional limit stop means mounted thereon, while the inner range of movement of the brake post 15 is limited either by its contact with the magnetic member 4 or by an indicating pin 15B striking the end of a slot in which it is rotatably mounted. Due to the magnetic flux produced by the magnetic member 4, it will be understood that the brake post 15 is continuously biased toward the magnetic member. Consequently, when the magnetic member 4 is moved toward its braked position, as shown in FIG. 1, the brake post 15 will be pulled toward either a seated position within one of the detents of the first set of detents 13 or on one of the lands 13A. If the initial contact between the brake post and the magnetic member 4 causes the brake post to rest on one of the lands 13A (see FIG. 3) between the detents, and the magnetic member 4 is subsequently rotated due to vibration or other causes, the brake post 15 will be magnetically pulled into its lodged, recessed position in one of the detents 13 thereby to positively brake the magentic member and prevent any further rotation of it relative to the frame member 2. Thus, a primary objective of the invention is afforded.

The second set of detents 14 located on the opposite end of the magnetic member 4 is arranged to cooperate with the dog 12 to provide the positive clutch operation desired for the invention. Specifically, the dog 12 is operable, responsive to the magnetic member 4 being moved by the action of solenoid 8 against the idler clutch assembly 10, to enter at least one of the detents in the second set of detents 14 thereby to provide a positive driving coupling between the magnetic member 4 and the clutch idler gear assembly. More specifically, because the slot 11 is formed to slidably receive the dog 12 and restrict its angular movement to an angle smaller than the arcuate extent of one of the detents in the second set of detents 14, the angular rotation of the magnetic member 4, and of the continuously meshed rotatable gear driving the decade gear train of the associated meter dial, is limited to this small angular movement once the teeth 12B and 12C of the dog 12 have become seated in the second set of detents 14.

Of course, such positive clutching action is essential only if vibration or other forces tend to cause relative movement between the clutch idler gear assembly 10 and the magnetic member 4. Greater movement can occur with the present invention only during the limited area of travel during which the teeth 12B and 12C of the dog 12 are positioned on the lands 14A (see FIG. 4) between the detents 14. Such positioning of the dog 12 can occur, as briefly explained above, due to the novel mounting arrangement for the dog, which allows it to be completely retracted within the slot 11 in the core member 10B when the magnetic member 4 is moved against the core member. Because of the magnetic attraction between the magnetic member 4 and the magnetizable metal of the dog 12, there exists means for continuously biasing the dog toward the magnetic member 4 thereby causing it to seat the tooth portions (12B and 12C) of the dog in a detent (or detents) in the second set of detents 14 in response to the magnetic member 4 being moved against the core member 10B and rotated sufficiently to align the tooth portion of the dog with one of the detents. As indicated above, due to the fact that the shaft 5 is made of non-magnetic material, it does not interfere with the magnetic means for continuously biasing the dog 12 with the force of the magnetic flux on it produced by the magnetic member 4 pursuant to the invention.

It will be recognized that the dog 12 may be formed to have one or a plurality of teeth in its tooth portion. In this embodiment of the invention two teeth 12B and 12C are provided at diametrically opposing points extending from one planar side of the annulus 12A of the dog. The detents in the second set of detents 14 on the magnetic member 4 are arranged in diametrically opposite pairs to receive therein either or both of the teeth 12B and 12C on the dog 12. In alternative embodiments, it should be recognized that a dog structure may be successfully employed pursuant to the invention even though its teeth are not diametrically aligned, because a single tooth becoming lodged in a cooperating recess will provide a positive driving torque for the clutch assembly.

Similarly, it will be apparent that various forms of magnetic members can be used to develop a suitable magnetic member 4 for various embodiments of the invention. However, as shown in the drawings, in this form of the invention the magnetic member 4 comprises a generally cylindrical permanent magnet that is formed of pressed powdered magnetic material having a gear 4A formed integrally around its perimeter and having the first and second sets of detents 13 and 14 molded into opposite ends of the cylinder. Of course, a separately formed gear wheel could be used and assembled with a magnetic core portion to make the magnetic member 4, if desired, in some adaptations of the invention.

From the foregoing description of the invention it should be noted that FIG. 1 illustrates the component parts of the invention with the shiftable magnetic member 4 in its braked or positively stopped position. In this position the brake post 15 is seated within one of the detents of the first set of detents 13 on the magnetic member 4 and the teeth 12B and 12C of the clutch dog 12 are disengaged from the detents 14 in the other end of the shiftable magnetic member, being retained against the magnetic attraction of member 4 by the collar 5A on shaft 5. It will also be understood that when energization of the solenoid coil 8 has driven the magnetic member 4 to this brake position this action served to drive the brake post 15 outward relative to the bushing 16 in which it is slidably and rotatably mounted. That outward movement causes the brake post 15 to rotate and thereby turn an indicating pointer 15B, positioned in a helical slot in bushing 16, so that an operator looking at the face of the meter register plate 2A, and the pointer 15B, can readily ascertain the braked condition of the clutch and brake assembly. This indicating function is more fully described in the above-mentioned U.S. patent.

FIG. 2 of the drawing shows the shiftable magnetic member 4 in its positively engaged driving relationship to which it is driven by energizing the solenoid coil 8 in a reverse direction to attract the magnetic member 4 into contact with the core member 10B of the clutch idler gear assembly 10. The teeth 12B and 12C of the shiftable clutch dog 12 are seated respectively in either or both detents of the second set of detents 14, but these teeth may have initially rested on the lands 14A between the detents when the magnetic member 4 was first driven into contact with the core member 10B. If that were the case, a clutching action for the assembly would have been affected due to the frictional and magnetic forces existing between the soft iron of core member 10B and the permanent magnet material of magnetic member 4. However, if relative rotation subsequently occurs between these two members the teeth 12B and 12C of the dog will be attracted into the detents 14 by the continuous magnetic biasing force exerted on the dog 12 by the magnetic member 4, thereby to prevent further relative movement and provide a positive clutching action between the magnetic member 4 and the idler gear assembly 10 pursuant to the invention.

From the foregoing description of the invention it will be apparent that further modifications and alternative embodiments of it may be made without departing from its teaching; accordingly, it is our intention to encompass within the following claims the true spirit and scope of the invention.

What we claim as new and desire to secure by Letters Patent of the United States is:

1. A magnetic clutch and brake assembly for positively braking and driving a rotatable gear comprising:
   (a) a solenoid coil mounted in spaced relationship to said rotatable gear;
   (b) a shaft positioned within said solenoid coil;
   (c) a magnetic member reciprocally and rotatably mounted on said shaft in continuous meshing engagement with said rotatable gear;
   (d) first and second sets of detents positioned, respectively, on opposite ends of said magnetic member;
   (e) a brake post mounted in cooperating relationship with said first set of detents, whereby a portion of said brake post, with reciprocal and rotatable movement of said magnetic member, may be positioned within an aligned detent of said first set to provide positive braking of said magnetic member when said magnetic member is moved into contact with said brake post;
   (f) a clutch idler gear assembly mounted on said shaft with one end thereof positioned to come into frictional contact with the end of said magnetic member having said second set of detents positioned thereon, to thereby rotate said magnetic member;
   (g) a dog of magnetizable material mounted for limited axial movement on said shaft between said magnetic member and said clutch idler gear assembly, said dog being in continuous sliding engagement with said clutch idler gear assembly and said dog further being continuously biased toward said magnetic member under the influence of the magnetic field produced by said magnetic member, wherein said dog includes a tooth portion which may enter at least one aligned detent of said second set of detents to thereby provide a positive driving coupling between said magnetic member and said clutch idler gear assembly while said magnetic member is in frictional contact with said clutch idler gear assembly and being rotated thereby;
   (h) means for selectively energizing said solenoid coil to move said magnetic member between said brake post and said idler gear assembly to thereby alternatively brake said rotatable gear or couple said rotatable gear in driving relationship to said clutch idler gear.

2. An invention as defined in claim 1 wherein said first and second sets of detents each comprise, respectively, a series of angularly spaced recesses formed in otherwise generally flat areas on opposite end surfaces of said magnetic member to form circular patterns of recesses thereon.

3. An invention as defined in claim 2 wherein said brake post is formed of magnetizable metal and is slidably mounted within a predetermined range of movement in a frame member that also supports said shaft within the solenoid coil, said brake post being moved to the limit of its predetermined range of sliding movement toward said idler gear assembly responsive to said magnetic member being moved by energization of the solenoid into driving relationship with the idler gear assembly, and being moved to the other limit of its range of sliding movement responsive to said magnetic member being positioned in its braked condition against the brake post.

4. An invention as defined in claim 1 wherein said clutch idler gear assembly comprises a core member having an axial slot in the end thereof closest to said magnetic member, said slot being formed to slidably receive said dog therein and restrict its angular movement to an angle smaller than the arcuate extent of any detent in said second set of detents.

5. An invention as defined in claim 4 wherein said dog comprises a tooth portion having a longitudinal axis substantially greater in length than the width of said slot.

6. An invention as defined in claim 4 wherein the dog comprises an annulus and a tooth portion, the annulus being mounted around said shaft for reciprocal movement and said tooth portion being positioned within the axial slot in the core member, in combination with a collar on said shaft positioned to restrict the movement of the annulus away from the core member, said annulus being axially slidable between said collar and the core member sufficiently to enable the tooth portion of the dog to be completely retracted within the slot in the core member thereby to enable the core member to come into driving contact with said magnetic member without requiring the tooth portion of the dog to be positioned within the detents of said second set of detents.

7. An invention as defined in claim 1, wherein the biasing of said dog toward said magnetic member effectuates a seating of the tooth portion of the dog within a detent in said second set of detents when the magnetic member is moved against the core member and rotated sufficiently to align the tooth portion with one of said second detents.

8. An invention as defined in claim 7 wherein said shaft is formed of non-magnetic material and said tooth portion of said dog comprises a pair of teeth extending, respectively, from one planar side of said annulus at diametrically opposed points thereon.

9. An invention as defined in claim 8 wherein the detents in said second set of detents are arranged in diametrically opposite pairs to simultaneously receive therein said pair of teeth on the dog, and the axial slot in said core member being made to extend across one diameter thereof to an axial depth sufficient to enable the dog teeth to be completely retracted therein.

10. An invention as defined in claim 9 wherein said magnetic member comprises a generally cylindrical permanent magnet having a gear wheel formed around the perimeter thereof and positioned in said continuous meshing engagement with the rotatable gear, and having said first and second set of detents formed, respectively, in opposite ends thereof.

* * * * *